United States Patent [19]

Poorman et al.

[11] Patent Number: 4,902,354
[45] Date of Patent: Feb. 20, 1990

[54] HIGH TEMPERATURE ELECTRIC ARC FURNACE AND METHOD

[75] Inventors: Richard M. Poorman; Deborah D. Schmidt, both of Huntsville, Ala.

[73] Assignee: The United States of America as represented by the Administrator, National Aeronautics and Space Administration, Washington, D.C.

[21] Appl. No.: 205,898

[22] Filed: Jun. 13, 1988

[51] Int. Cl.$^4$ .............................................. C21D 1/09
[52] U.S. Cl. ...................................... 148/4; 148/149; 148/902; 148/903
[58] Field of Search .................... 148/4, 903, 149, 902, 148/150; 266/260

[56] References Cited

U.S. PATENT DOCUMENTS 4,015,100  3/1977  Gnanamuthu et al. ............. 148/903
4,122,240 10/1978  Banas et al. ......................... 148/903

FOREIGN PATENT DOCUMENTS 2134662  1/1973  Fed. Rep. of Germany ...... 148/903
3231774  4/1983  Fed. Rep. of Germany ...... 148/149
2077421  4/1987  Japan ................................... 148/903

OTHER PUBLICATIONS

German '858, Derwent Abstract, 36587y/21, 12-11-75.

Primary Examiner—S. Kastler
Attorney, Agent, or Firm—William J. Sheehan; John R. Manning; Jerry L. Seemann

[57] ABSTRACT

An apparatus and process for improving the microstructure of electrically conducting materials is disclosed by the present invention. A revolving heat source applies heat to the surface of the material evenly and quickly. One or more heat sinks quickly cool the material. In the preferred embodiment, the cooling may be done in such a way as to promote as high a degree of directional grain growth as desired or completely non-directional grain growth.

1 Claim, 1 Drawing Sheet

HIGH TEMPERATURE ELECTRIC ARC FURNACE AND METHOD

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

This invention relates to apparatuses and processes for improving the microstructure of electrically conducting materials. More specifically, the present invention relates to an apparatus and process for substantially improving the grain size of electrically conducting materials such as metals and alloys and for forming grain boundaries in a directional or nondirectional manner, whichever is desired.

Electrically conducting materials such as elemental metals, metallic alloys, and some ceramics, can be characterized by their microstructure, which includes phase morphologies. The particular microstructure of a specific sample of material depends on many variables, one of which is how it was processed. For example, MAR-M246(HF) (a nickel-based superalloy) was melted and solidified with the process described in this patent. The microstructure was enhanced by various changes in phase morphology. These included eliminating gamma-gamma prime eutectic phase islands from the section of rod which was melted and solidified with this process. Also carbide morphology was changed from large script-types to extremely small, fine, extremely well dispersed carbides. Other rods of MAR-M246(HF) with an original small, fine block carbide morphology were processed in this same manner. The resulting carbide morphology change after melting and solidification was the same; extremely small, fine, and extremely well dispersed carbides.

The microstructure of these materials, and/or relative orientation of the boundaries of the grains of these materials, gives them different mechanical properties. In some applications nondirectional or equiaxed microstructure is preferable to more high directional structure. In other applications, the reverse is true, such as when the material may see greater stresses and be subjected to greater fatigue in one direction than in another.

The present invention is an apparatus and a process for significantly improving the microstructure of electrically conducting materials by reducing the size of the material's grains and for determining the microstructure of the material which includes establishing the desired relative directionality of the grain boundaries.

It is an object of the present invention to improve the microstructure of electrically conducting material. It is another object of the present invention to rapidly melt and quickly cool electrically conducting materials. It is still further an object of the present invention to evenly melt and unevenly cool electrically conducting materials when a higher degree of directional grain growth is desired.

It is yet a further object of the invention to establish very fine carbide morphology and the desired microstructure of a particular sample of electrically conducting material.

These and other objects of the invention will become apparent to someone skilled in the art of apparatuses and processes for improving the microstructure of electrically conducting material upon reviewing the following description of the invention.

SUMMARY OF THE INVENTION

The present invention is an apparatus and a process for improving the microstructure of electrically conducting materials. The apparatus comprises a source of intense heat, such as an inert gas tungsten arc, a laser welder, focused thermal radiation or an electron beam, that can quickly melt the surface of the material to be improved. Specifically, the heat source must be capable of melting a 3 mm diameter rod, 10 mm in length, within approximately 5 seconds.

The heat source must be capable of moving rapidly over the surface to heat the material both quickly and evenly. The rate of movement and the degree of heating must be controllable by standard means so that a wide variety of types and shapes of materials can be improved by the instant invention.

In the preferred embodiment, the heat source revolves about the material near to the surface, heating the surface to bring the temperature of the material quickly to its melting temperature. It is also desirable in the preferred embodiment that the revolving source apply heat to each portion of the surface in any single pass so that the heat is evenly applied.

The material must be quickly cooled to resolidify it within a few seconds. A 3 mm diameter rod, 10 mm in length, must be resolidified in approximately 10 seconds. In order to cool it that quickly, heat sinks capable of establishing a large temperature gradient across the boundary of the surface of the material and the surface of the heat sink must be provided adjacent to the material.

The heat sinks should have a surface equal to or smaller than the surface of the material when a highly directional grain growth pattern is desired. The cooling will then take place in the direction of the gradient and grain growth will follow the cooling. Thus, by placing heat sinks at specific locations the grain growth can be rather precisely controlled.

Alternatively, the heat sink can be the atmosphere surrounding the material when no particular directionality in grain growth is required. It is only necessary that the temperature of the heat sink be sufficiently lower than the solidifying temperature of the material so that the large temperature gradient is established at all points on the surface of the material.

The present invention is especially advantageous for material to be processed in a near zero-gravity environment. The weightlessness allows a melted sample to be held in place by its own surface tension rather than a support that interferes with the heating and melting of the material. Also, the rotation of the heat source is unobstructed in the weightless, unsupported condition since it does not have to avoid the material support and can heat the entire surface of the material.

Several examples of the improvements of the present invention are provided. To facilitate even heating and cooling, the samples of material were made in the form of rods approximately 90 mm long and diameters of 2 to 5 mm. Copper, aluminum, tungsten and a nickel-based superalloy were used as sample materials. Large aluminum heat sinks were placed at each end of a rod. The aluminum heat sinks were in the form of cylinders 13 mm in diameter and 25 mm long. The region of the rod that was melted and resolidified is called a nugget.

A commercial inert gas tungsten tube welder capable of 100 amperes DCSP was used to melt a portion of each rod. The weld arc revolved around the axis of the particular rod in each test. The melting took approximately 5 seconds; cooling took approximately 10 seconds.

The experiments were performed in a near weightless environment achieved in a single, parabolic climb and dive of a KC-135 aircraft, although the present invention does not require a specific aircraft or weightless conditions.

Table A reflects the results of ground test samples verified in microgravity flight.

DESCRIPTION OF THE DRAWINGS

The construction designed to carry out the invention will hereinafter be described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
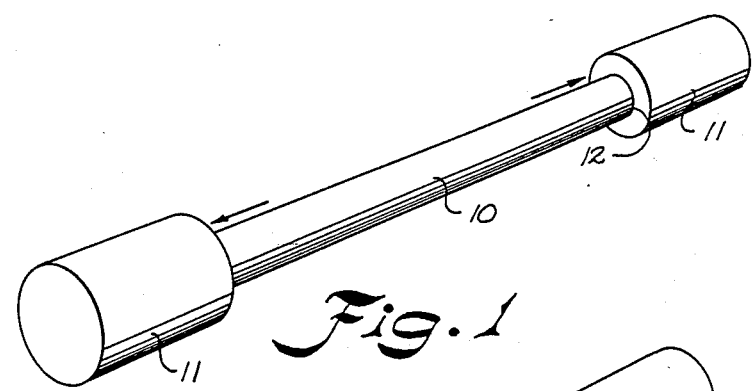
FIG. 1, showing a perspective view of a rod sample and heat sink configuration.

The present invention is an apparatus for improving the microstructure of an electrically conducting material. The invention applies heat energy to the surface of the material which heat energy is conducted to the interior of the material.

The invention comprises a means for heating the material when the source of heat is positioned adjacent to a portion of the surface of the material. The heat energy supplied to the surface is of sufficient intensity to cause the temperature of the material to rise to or above the melting temperature of the material so that the material melts. The source of heat must be capable of melting a 3 mm diameter rod of material 10 mm long within approximately 5 seconds.

The apparatus has a means for controlling the heating means which is operatively connected to the heating means. In the preferred embodiment, a laser, an inert gas tungsten arc, focused thermal radiation or an electron beam can be used to apply heat energy to the surface of the material. Standard controlling devices for energizing and deenergizing these heat sources and for controlling the level of heat energy applied are widely available.

The apparatus also comprises a means for revolving the heat source about the surface of the material whereby approximately all portions of the surface may be heated in any one revolution. The revolving of the heat source assures that the heating is done uniformly over the entire surface of the material to be heated and that the material is melted throughout at approximately the same time. The rate at which the revolving heat source moves is controlled by standard means preferably electrical and its rate of movement, path and level of applied heat energy can be programmed for a given sample size and shape. For a sample that is rod shaped, approximately 3 mm in diameter, the heat source should be capable of revolving at least 10 times per minute, and preferably at least sixty times per minute.

Heat sinks positioned adjacent to the material provide a means for cooling the material by receiving heat energy from the melted material across the boundary between the surface of the material and the surface of the heat sink. The heat sinks may be in position before the heating is done or moved into position after the heating is done. It is important, however, that the cooling be done quickly. If the heat sinks are positioned after the heating, a means for controlling the cooling is provided by any suitable electrical or electromechanical apparatus. If the cooling means is the ambient temperature of the environment, a means must be provided to maintain the temperature of that environment sufficiently below the solidification temperature of the material so that a large temperature gradient will exist across the boundary between the surfaces of the heat sinks and the material to assure rapid cooling.

If directional grain growth is desired, the surfaces of the heat sinks will be equal to or smaller than the surface of the material so that there is a preferential flow of heat energy from the melted material through the material in the direction of the heat gradient established at the heat sink boundary.

The present invention is also a process for improving the microstructure of an electrically conducting material. The process comprises the rapid and even application of heat to the surface of the material until the temperature of the material is above the melting temperature so as to melt the material being processed all at approximately the same time at which time the heating is halted and followed by the rapid cooling of the material below the solidification temperature of the material so that the material solidifies.

The heating is most evenly accomplished by moving a heat source rapidly over the entire surface of the material, energizing the heat source so that heat is applied at sufficient intensity to melt the material.

The heat sinks may be placed at any part of the surface of the material where heat flow out of the material and into the heat sink is desired. The arrangement can be as simple or as complex as desired based on the ultimate purpose to be served by the material.

In the configuration selected for experimentation, shown in FIG. 1, a rod 10 is positioned between heat sinks 11. The heat sinks 11 will produce a gradient across the heat sink/rod boundary 12 and its counterpart at the other end of the rod. Thus, grain growth will take place in direction shown by the arrows.

Figure 2:
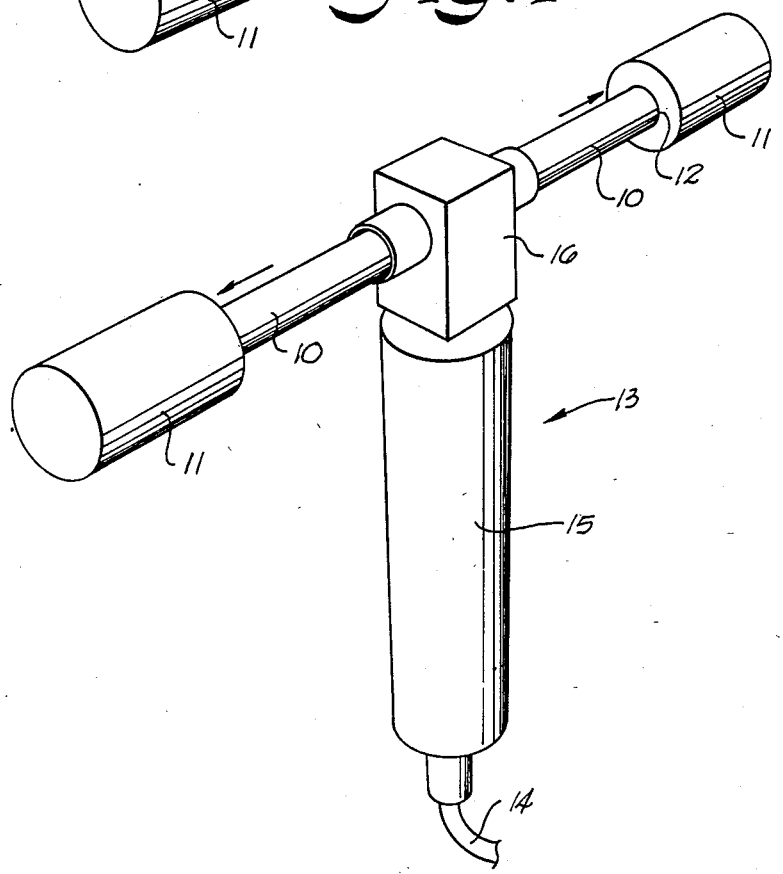
FIG. 2, showing a perspective view of heat source on the rod sample.

In FIG. 2, rod 10 is being heated by heat source 13 such as an Automatic Tube Welder Model PA-100STW manufactured by Weldlogic, Inc., of Chatsworth, Calif. or NIKA-BTW Model 9121 ST International. This heat source 13, having a power cable 14, a handle 15, and a weld head 16 surrounds the rod 10. An inert gas tungsten arc within the weld head 16 orbits rod 10.

While a preferred embodiment of the invention has been described using specific terms, such description is for illustrative purposes only, and it is to be understood that changes and variations may be made without departing from the spirit or scope of the following claims.

| Sample No. | Material | Arc Length | Current | RPM | Position | Nugget Size | Remarks |
|---|---|---|---|---|---|---|---|
| 1 | Aluminum | 0.635 mm | 30 amp. | 24 | Hor. | 4.76 × 5.33 mm | |
| 2 | Aluminum | 1.24 mm | 30 amp. | 24 | Hor. | 4.76 × 6.2 mm | |
| 3 | Aluminum | 1.24 mm | 30 amp. | 8 | Hor. | 4.76 × 7.1 mm | Nugget is longer on top, arc started on side and moved under |
| 4 | Aluminum | 1.24 mm | 50 amp. | 24 | Vert. | 4.76 × 18.4 mm | |
| 5 | Aluminum | 1.24 mm | 50 amp. | 24 | Hor. | 6.2 × 5.7 mm | |
| 6 | Aluminum | 1.24 mm | 75 amp. | 24 | Vert. | 6.2 × 13.9 mm | |
| 7 | Copper | 1.24 mm | 75 amp. | 24 | Vert. | 4.1 × 3.2 mm | |
| 8 | Copper | 1.24 mm | 75 amp. | 24 | Hor. | 4.1 × 4.3 mm | Nugget sagged about 1.5 mm |
| 9 | Tungsten | 1.24 mm | 90 amp. | 24 | Vert. | 3.2 × 2.8 mm | |
| 10 | Tungsten | 1.24 mm | 100 amp. | 24 | Vert. | 3.2 mm | Gravity opened melt zone |

NOTES:
Arc lengths resulted in voltages of 9 and 14 volts (Argon Shielding Gas) (DCSP). Nugget sizes are sample diameter × nugget length in millimeters. All samples were made at Merrick Engineering, Nashville on an orbital tube welder. RPM is the rate the arc moved around the sample (revolutions per minute).

What is claimed is:

1. A process for improving the microstructure of an electrically conducting material, said material having a thickness of at least three (3) millimeters, comprising the steps of:
   a. in a zero-gravity environment, heating said material to a molten state throughout said thickness, said heating occurring during a period of approximately five (5) seconds;
   b. while maintaining a zero-gravity environment, allowing said material to cool and resolidify while using at least two heat sinks in contact with said material, said cooling and resolidification occurring during a period of approximately ten (10) seconds;
   whereby said heat sinks induce temperature gradients in said material during said cooling step sufficient to cause grain growth in the direction of said temperature gradients.

* * * * *